(12) United States Patent
Bradley et al.

(10) Patent No.: US 8,593,158 B1
(45) Date of Patent: Nov. 26, 2013

(54) CALIBRATED TWO PORT PASSIVE INTERMODULATION (PIM) DISTANCE TO FAULT ANALYZER

(75) Inventors: Donald Anthony Bradley, Morgan Hill, CA (US); Alan Charles Witty, Hollister, CA (US)

(73) Assignee: Anritsu Company, Morgan Hill, CA (US)

( * ) Notice: Subject to any disclaimer, the term of this patent is extended or adjusted under 35 U.S.C. 154(b) by 219 days.

(21) Appl. No.: 13/295,364

(22) Filed: Nov. 14, 2011

Related U.S. Application Data

(62) Division of application No. 12/246,330, filed on Oct. 6, 2008, now Pat. No. 8,058,880.

(51) Int. Cl.
*G01R 27/04* (2006.01)
(52) U.S. Cl.
USPC .................. 324/644; 324/580; 324/76.19
(58) Field of Classification Search
USPC ............... 324/637, 638, 642, 644, 650, 76.19
See application file for complete search history.

(56) References Cited

U.S. PATENT DOCUMENTS

| | | | | |
|---|---|---|---|---|
| 4,274,047 A | * | 6/1981 | Hecken | 324/624 |
| 5,706,010 A | * | 1/1998 | Franke | 342/47 |

* cited by examiner

*Primary Examiner* — Vincent Q Nguyen
(74) *Attorney, Agent, or Firm* — Fliesler Meyer LLP

(57) ABSTRACT

A PIM measurement circuit enables making forward and reverse PIM measurements on any 1 port (reflection) or 2 port (transmission) device with the ability to determine in distance where individual PIM impairments are located as well as their magnitude. The PIM measurement circuit includes two frequency sources that are provided through a combiner for a CW characterization of the PIM circuit. To enable distance determination, an FM measurement is created by using a saw tooth offset sweep generator attached to one of the two frequency sources. With downconversion and processing of signals from the PIM impairments, the FM signal provides a frequency variation that is converted using a Fourier transform or spectrum analysis for separation of frequencies, enabling determination of the distance of the PIM sources as well as their magnitudes.

5 Claims, 11 Drawing Sheets

CALIBRATED TWO PORT PASSIVE INTERMODULATION (PIM) DISTANCE TO FAULT ANALYZER

CLAIM OF PRIORITY

This application is a Division of U.S. patent application Ser. No. 12/246,330, entitled "Calibrated Two Port Passive Intermodulation (PIM) Distance to Fault Analyzer" by Bradley, et al., filed on Oct. 6, 2008, the entire contents of which are incorporated herein by reference.

BACKGROUND

1. Technical Field

The present invention relates to a single (reflected) or a two port (transmission) distance to fault analyzer configured to measure passive intermodulation (PIM) created by two separate signal sources as well as to measure distance to a fault creating PIM.

2. Related Art

FIG. 1 shows a block diagram of components of a prior art test system setup for measuring PIM. The test system utilizes two signal sources 2 and 4, with a first signal source 2 producing a signal at frequency F1 and the second signal source 4 producing a signal at frequency F2. When these multiple signals are allowed to share the same signal path in a nonlinear transmission medium, unwanted additional signals occur. The $3^{rd}$ order response is particularly troublesome as it produces signals at 2F1-F2 as well as 2F2-F1. The term widely uses for this phenomenon is Passive Intermodulation or PIM. The PIM test system of FIG. 1 measures this phenomenon.

In the system of FIG. 1, the signal sources 2 and 4 are provided through high power amplifiers (HPAs) 6 and 8 and isolators 10 and 12 to a hybrid combiner 14 to create a combined signal with frequencies F1 and F2 at the hybrid combiner 14 output. The duplexer 16 sends the signals F1 and F2 to the test port P1. A reverse or reflected signal from port P1 is then produced at frequency 2F1-F2, and forwarded through duplexer 16 to switch 18. The switch 18 in the receive (R) position provides the signal 2F1-F2 through an amplifier 20 to a digital receiver or spectrum analyzer 22 for measurement. The port P1 can be connected by cable to port P2 and switch 18 switched over to make a transmission (T) measurement. With the transmission measurement, signals are provided at F1 and F2 with mixing products at 2F1-F2 to port P2. The duplexer 26 provides the signals F1 and F2 to termination 24, while the signal 2F1-F2 is provided from duplexer 26 through switch 18 and amplifier 20 to the digital receiver or spectrum analyzer 22 for measurement.

FIG. 2 shows an example of actual frequencies used when measuring a load with the test system setup of FIG. 1. Components carried over from FIG. 1 to FIG. 2 are similarly labeled, as will be components carried over in subsequent figures. The two signals F1 and F2 and how they create a third interfering signal can be explained using an example measurement setup with two distinct transmitters, a Personal Communication Service or PCS Band transmitter 2 transmitting at F1=1930 MHz and an Advanced Wireless Service or AWS Band transmitter 4 transmitting at F2=2127.5 MHz. The PIM produced signal, which can be the result of reflection from a corroded connector or antenna in the transmission path, is simulated by PIM source 30 attached to port P1. It is unknown where an actual PIM or multiple PIM sources may be located. This can be especially troubling when multiple connectors are involved as can be present in a PCS/AWS site tower. But, the PIM source 30 in combination with its connecting cable and load can be designed to simulate reflection from at least one connector.

The PIM source 30 generates a signal at 2×1930−2127.5=1732.5 MHz that is in the receive Band of the AWS system 4. A signal is produced at 2F2-F1=2325 MHz, as also shown in FIG. 2, but since that signal is outside the transmit or receive band of either transmitter 2 and 4, it is not relevant to the present measurement. The two signals transmitted from sources 2 and 4 produce about 40 watts of power for each carrier or +46 dBm each. The resulting PIM signal is on the order of −100 dBm.

The receive channel of the AWS source 4 in an actual operating environment can be desensitized by this interfering signal due to the broadband noncorrelated characteristic of the modulation present on both transmit carriers spreading the power over the entire receive channel. DIN 7-16 coax cable connectors typically have PIM values on the order of −140 to −168 dBc. The PIM measurement, thus, must detect signals that are <−146 dBc. Since the desired PIM signal to be measured is the 1732.5 MHz signal, the bandpass filter 32 with center frequency of 1732.5 is used to filter out other signal components and provide the PIM signal for measurement to the digital receiver or spectrum analyzer 22. An exemplary digital receiver or spectrum analyzer 22 used to perform the test can be a Summitek Instruments Model S12000D Passive Intermodulation Analyzer in the D configuration or a Telstra PIMT2V2 low power PIM Tester.

SUMMARY

Embodiments of the present invention enable making through and reflected PIM measurements on any one port or two-port device with the ability to determine, in distance, where the individual PIM impairments are located. The one port measurements can be typical reflection measurements made using a vector network analyzer and the two port measurements can similarly be conventional transmission measurements made using a VNA. The difference between the VNA measurement and the PIM measurement is the VNA measurement separates the forward signal and the reverse signal using a directional coupler. The PIM measurement separates the forward signal and the reverse signal using a frequency selective duplexer.

In embodiments of the invention, a PIM measurement circuit includes two frequency sources that are provided through a combiner for a CW characterization of the PIM circuit. To enable distance determination, an FM measurement is created by using a saw tooth offset sweep generator attached to one of the two frequency sources operating at a significantly lower frequency than the frequency source. With downconversion and processing of the signal from the PIM circuit, the FM signal provides a frequency variation that is converted using a Fourier transform to time domain, enabling determination of the distance and magnitude of the PIM source. Multiple PIM sources separated in distance translate to multiple FM signals separated in frequency. Spectrum analysis can also be used to determine distance to each of the multiple PIM sources as well as signal magnitude from each PIM source.

To create a 2F1-F2 signal used for downconversion of the PIM source signal, in one embodiment a 2× frequency converter is connected to the signal source providing the signal of frequency F1. The signal source providing F2 for downconversion can be either the same as that provided to the PIM, or a separate signal source providing a frequency F2 minus the saw tooth offset sweep signal to allow a forward (ramp up)

trace signal while eliminating a reverse (ramp down) trace generated with the saw tooth offset sweep.

In some embodiments to determine distance only, phase shift rather than frequency shift can be used. To determine distance using phase shift, in one embodiment instead of downconverting the 2F1-F2 signal directly using a mixer to determine a frequency shift, a phase detector is used to measure the phase shift. In an alternative embodiment, a 0/90 degree phase splitter can be used to produce a quadrature signal with the Real and Imaginary components to enable measuring the 2F1-F2 PIM signal using linear quadrature detection circuitry. The magnitude and phase are retained in this arrangement. In yet another embodiment, down conversion to a fixed base band signal is used to determine distance as well as to measure both amplitude and phase to fully characterize the PIM signal.

In some embodiments of the present invention to enable precise distance measurements, circuitry is further provided to enable calibration to be performed. Calibration can be performed using a load, a calibrated PIM, and a quarter wave length section of cable to identify a 180 degree phase rotation at the frequency of the PIM. A cable can also be connected to make a through measurement. Internal switches and duplexers are included in various embodiments to enable calibration with the two separate signal sources.

BRIEF DESCRIPTION OF THE DRAWINGS

Further details of the present invention are explained with the help of the attached drawings in which.

DETAILED DESCRIPTION

Figure 1:
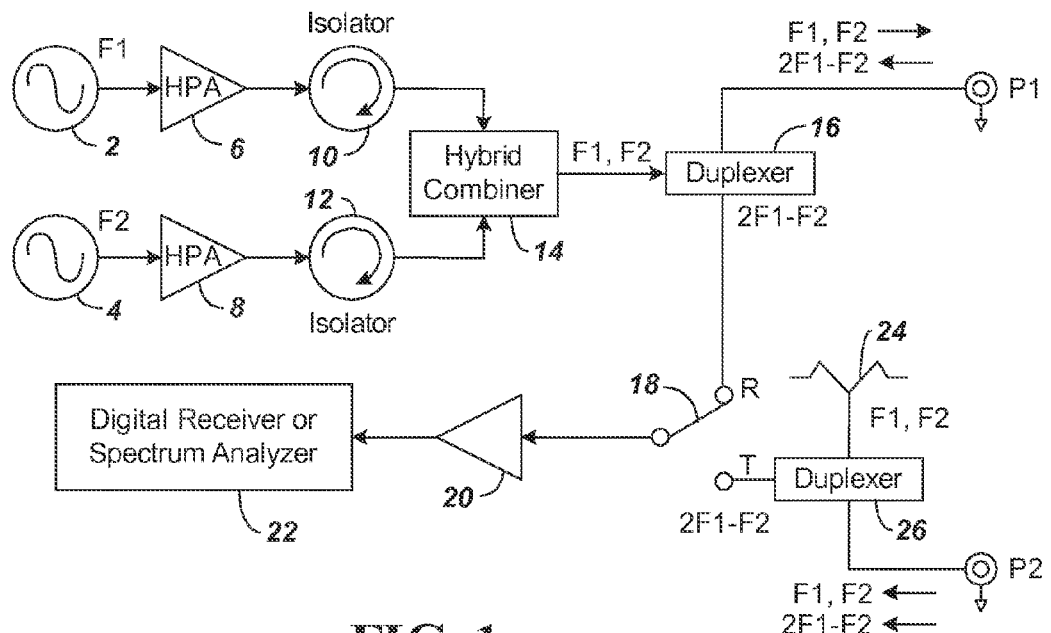
FIG. 1 shows a block diagram of components of a prior art test system setup for measuring passive intermodulation (PIM)
Figure 2:
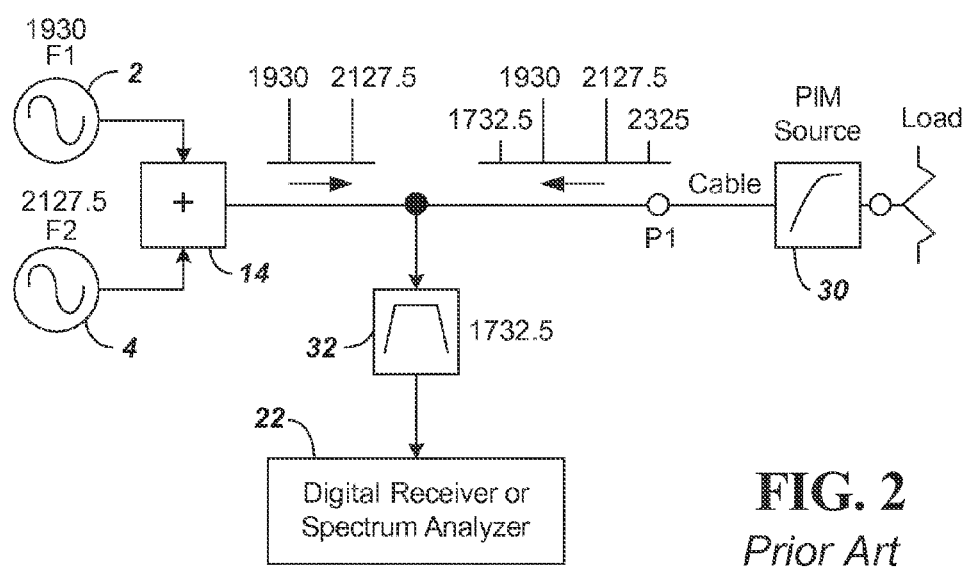
FIG. 2 shows an example of actual frequencies used when measuring a load with the test system setup of FIG. 1.
Figure 3:
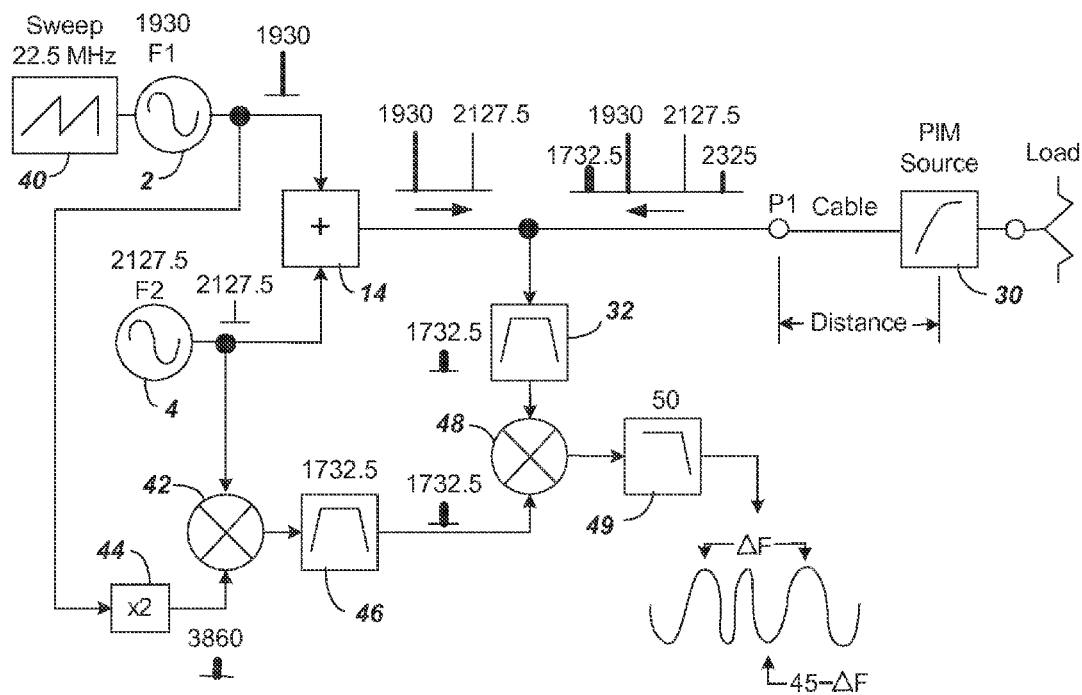
FIG. 3 shows the block diagram of components of a first embodiment of the present invention using FM-CW as a means of determining distance with a PIM measurement device.

FIG. 3 shows the block diagram of components of a first embodiment of the present invention using FM-CW as a means of determining distance in a PIM measurement device. The FM sweep is introduced using sweep generator 40. The sweep generator 40 is connected to F1 source 2. For purpose of illustration, the sweep generator 40 is shown creating a 1.4844 uS period saw tooth causing a +/−11.25 MHz modulation (ranging 22.5 MHz as shown) that is added to F1 of source 2. The FM sweep signal F1 and the fixed signal F2 when modified by the PIM source will produce the additional signals 2*(F1+FM)-F2 and 2*F2-(F1+FM). The delayed in time (distance) signal 2*(F1+FM)-F2 will be mixed with an internally generated non delayed in time (distance) signal 2*(F1+FM)-F2 to produce the desired measurement signal $\Delta F$. The $\Delta F$ signal represents 68597× distance in feet. The distance to fault from P1 can, thus, be determined by distance in feet=$\Delta F$/68597.

The circuitry of FIG. 3 has components added to accomplish addition of the sweep generator frequency and then downconversion of the output signal for analysis. To provide a signal source for downconversion, the circuitry includes a ×2 frequency multiplier 44 connected to the F1 source 1930 to provide a 3860 MHz output with a +/−22.5 MHz sweep. The output of the ×2 frequency multiplier 44 is provided to a first input of a newly added mixer 42. The second input of mixer 42 is provided from the F2 signal generator 4, so that the output of mixer 42 provides a frequency 3680−2127.5=1732.5 MHz. Bandpass filter 46 centered at 1732.5 MHz eliminates other mixing products from mixer 42 to provide a first input to downconverting mixer 48. A second input of mixer 48 provides the reflected test signal at 1732.5 MHz from bandpass filter 32. With both inputs of mixer 48 at 1732.5 MHz, they are downconverted at the output of mixer 48, leaving substantially only the frequency deviation $\Delta F$ due to reflection of a test signal created by the PIM source 30. A lowpass filter 49 removes mixing products higher than 50 MHz, leaving only the forward trace sweep $\Delta F$ and retrace sweep signal 45 MHz−$\Delta F$. Measurement of $\Delta F$ with a digital receiver using Fourier transform to time domain or a spectrum analyzer gives a measurement of total distance from port P1 to the PIM source using the formula Distance in feet=$\Delta F$/68597, with post processing to account for the both the forward sweep $\Delta F$ and retrace 45 MHz−$\Delta F$.

Exemplary signal frequencies are shown in FIG. 3, as well as subsequent drawings, to illustrate operation of the circuitry and are not intended to limit the operation frequencies that can be used with the circuitry. Further in FIG. 3 and in subsequent drawings included with the specific frequency number a signal type indicator. As shown, a 1 unit thickness indicator represents a non-modulated signal, a 2 unit thickness indicator represents a modulated signal, and a 4 unit thickness indicator indicates a signal that is both modulated and doubled in frequency. Also illustrated in FIG. 3 are the forward sweep $\Delta F$ signal lobes and the retrace signal (45−$\Delta F$) signal lobe illustrating the difference in these signals as generated by the circuitry of FIG. 3.

Figure 4:
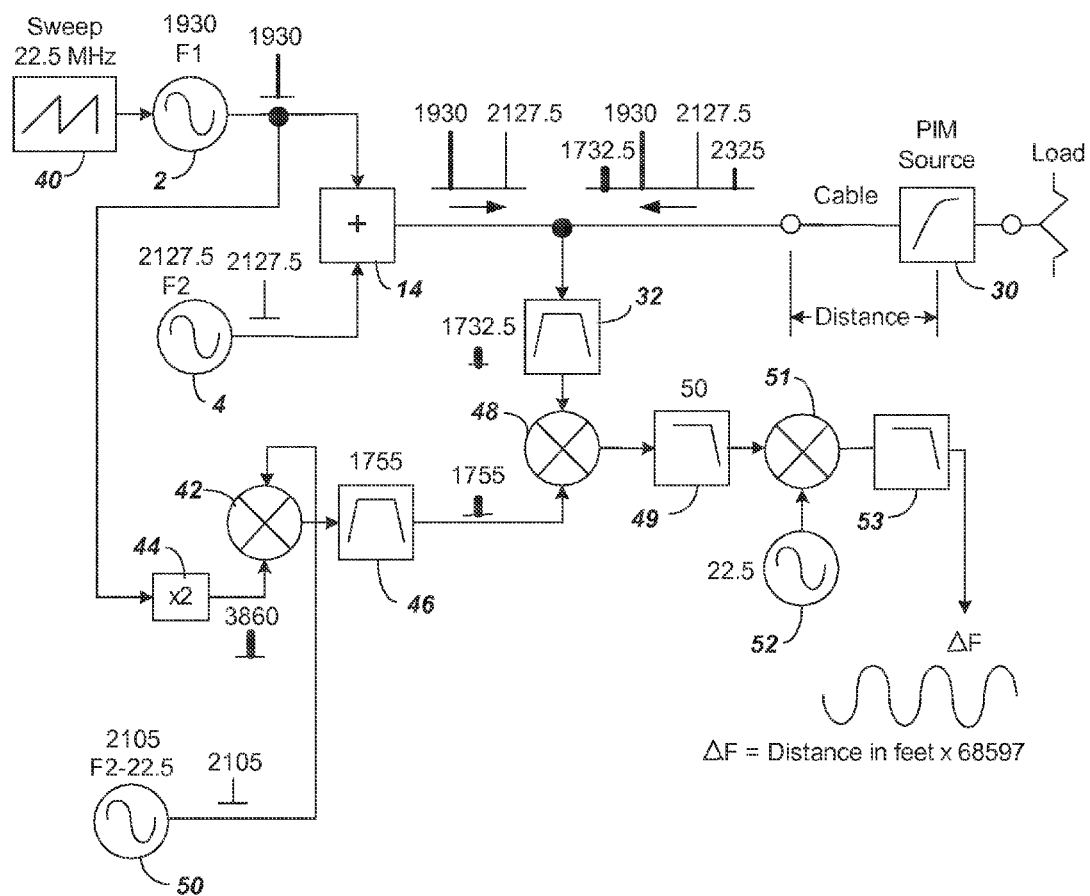
FIG. 4 shows an alternative to the circuitry to FIG. 3 for determining distance to fault using FM-CW in a PIM measurement device that will transpose the reverse sweep to the same frequency as the forward sweep.

FIG. 4 shows an alternative to the circuitry to FIG. 3 for determining distance to fault that will eliminate the retrace (45 MHz−$\Delta F$) from the output frequency. The result will be a detected frequency of $\Delta F$=distance×68597 for both the forward sweep and the retrace sweep. This eases the post processing burden as well as increases the signal to noise ratio of the measurement.

The circuit of FIG. 4 includes an additional oscillator 50 operating at F2 minus the sweep frequency of sweep generator 40 (2127.5−22.5=2105 MHz in the example shown). The output of oscillator 50 is applied to the second input of mixer 42 instead of the output of the F2 oscillator 4 that is connected in FIG. 3. Thus, the output of the mixer 42 is now a signal at frequency 3860−2105=1755 MHz. The bandpass filter 46, thus, has a center frequency adjusted to 1755 MHz. The output of bandpass filter 46 at 1755 MHz mixes in mixer 48 with the output of bandpass filter 32 to provide a signal at $\Delta F$−22.5 MHz for the forward sweep and 45 MHz−$\Delta F$−22.5 MHz=22.5 MHz−$\Delta F$ for the retrace. These signals when mixed in mixer 51 with a fixed 22.5 MHz signal from oscillator 52 and provided through filter 53 will produce $\Delta F$−22.5 MHz+22.5 MHz=$\Delta F$ for the forward sweep and 22.5 MHz−$\Delta F$−22.5 MHz=−$\Delta F$ for the retrace. The distance to fault from the port P1 can, thus, be measured using the formula Distance in feet=$\Delta F$/68597 without significant post processing.

Figure 5:
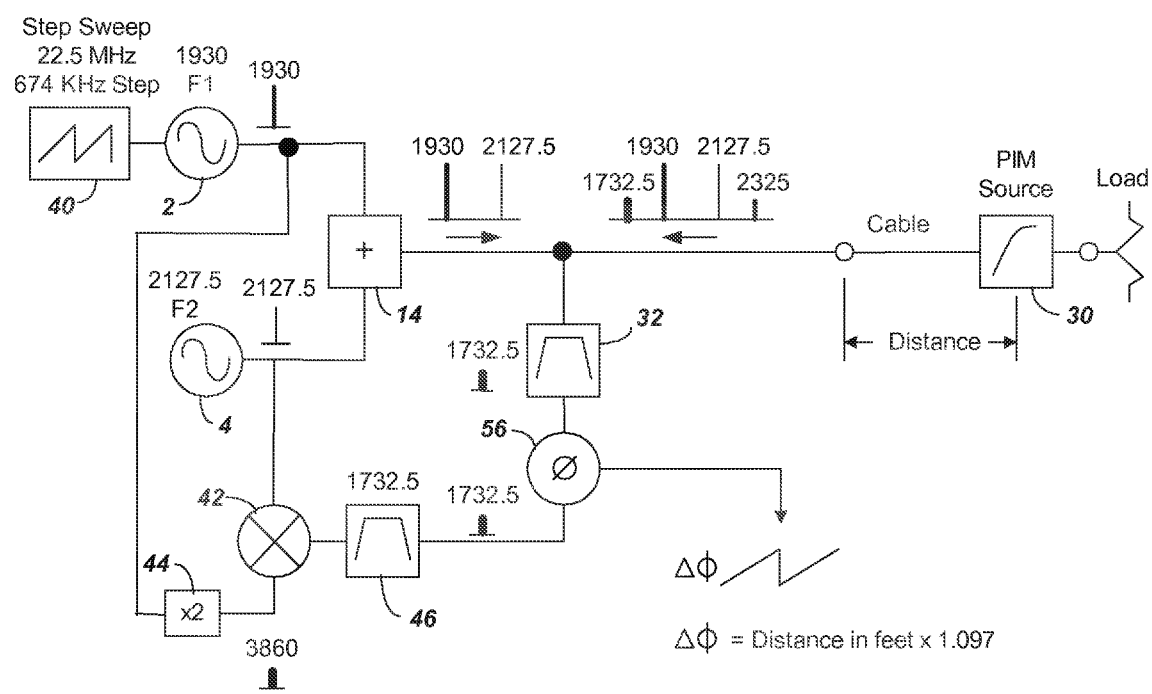
FIG. 5 shows a block diagram of a PIM measurement device using CW signals, but using phase shift, as opposed to frequency shift as in FIGS. 3-4, as a means of determining distance to fault.

FIG. 5 shows a block diagram of a PIM measurement device using CW signals, but using a change in phase, as opposed to frequency shift as in FIGS. 3-4, as a means of determining distance to fault. The sweep generator 40 uses a step frequency of 674 KHz over 33.4 steps causing a +/−11.25 MHz frequency change on F1. The reflected PIM signal will produce a phase change at phase detector 56 equal to distance in feet=$\Delta \phi$ degrees/1.097.

The circuit of FIG. 5 substitutes a phase detector 56 for the mixer 48 and lowpass filter 49 of FIG. 3. The inputs of the phase detector are provided from the outputs of bandpass filters 32 and 46. The filters 32 and 46 provide equal frequency outputs, both shown as 1732.5 MHz, so that the phase detector 56 then provides the phase change measurement signal $\Delta \phi$. Distance in feet from the port P1 to the PIM source can be determined in feet using the formula distance in feet=$\Delta \phi$ degrees/1.097. No amplitude measurement of the PIM signal, however, will be available from the output of phase detector 56.

Figure 6:
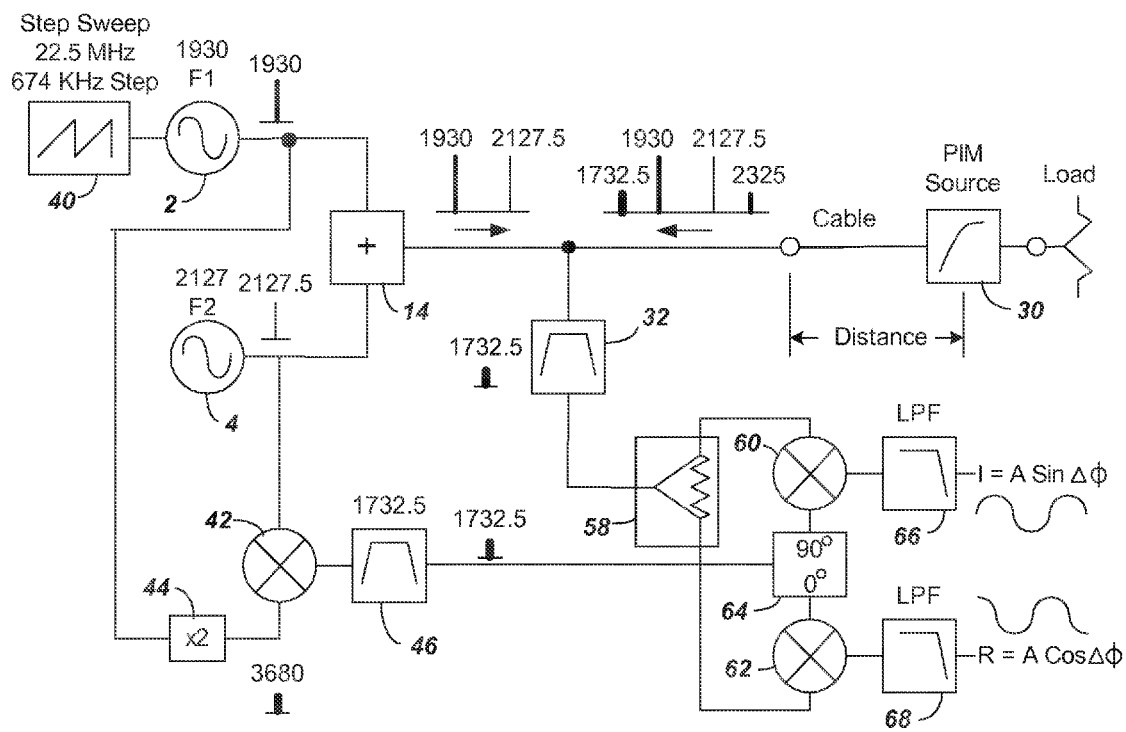
FIG. 6 shows modification to the block diagram in FIG. 5 with a linear quadrature detector circuitry added allowing both amplitude and phase measurements of the PIM signal.

FIG. 6 shows modification to the block diagram in FIG. 5 with a linear quadrature detector circuitry added allowing both amplitude and phase measurements of the PIM signal. The circuitry includes a 0/90 degree phase splitter 64 with both a 0 degree and a 90 degree phase shifted output to provide Imaginary and Real signal components to first inputs of mixers 60 and 62. The phase splitter 64 receives an input from bandpass filter 46. A 0 degree power splitter 58 receives the output from bandpass filter 32 and provides second inputs to the two mixers 60 and 62. The output of the mixer 60 is provided through low pass filter (LPF) 66 to provide an imaginary signal (I). The output of mixer 62 is provided through low pass filter (LPF) 68 to provide a real signal (R).

As indicated in the FIG. 6 the value for $\Delta \phi$=arctangent (I/R) with I being the Imaginary component from mixer 60 and R being the real component signal from mixer 68. The value of the PIM magnitude can be calculated by $\Delta$=squareroot($I^2$+$R^2$).

Figure 7:
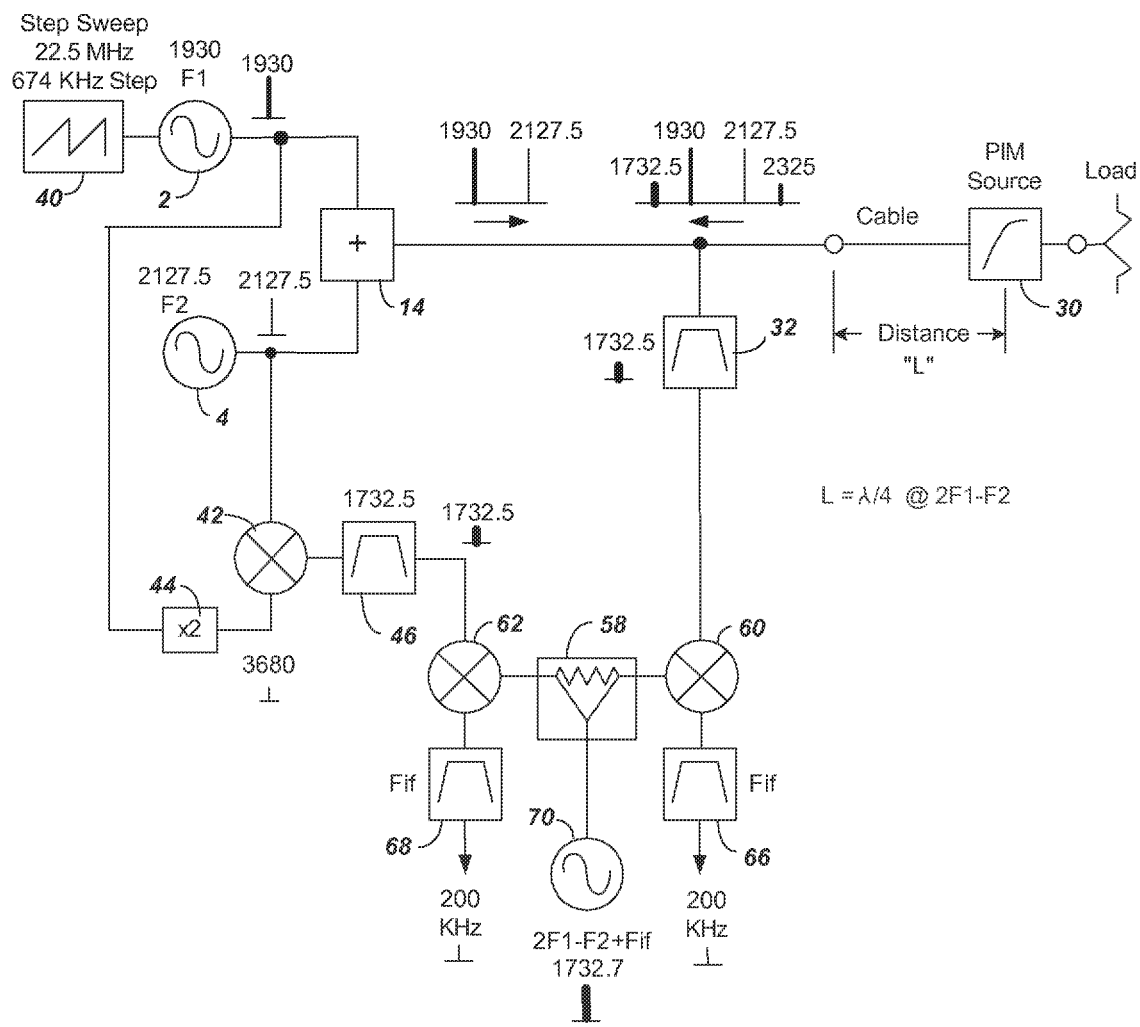
FIG. 7 shows modification to the block diagram of FIG. 5 that downconverts the varying frequency PIM signals to fixed 200 KHz offset baseband signals while still retaining the amplitude and phase of the original signals.

FIG. 7 shows modification to the block diagram of FIG. 5 that downconverts the varying frequency PIM signals to fixed 200 KHz offset baseband signals to allow measurement of distance to a PIM source as well as magnitude of the PIM source using low frequency A/D conversion. In FIG. 7 an oscillator 70 is added operating at the frequency 2(F1+FM)−F2 plus the desired fixed offset intermediate frequency (Fif) to serve as a local oscillator for downconversion to baseband. Here with the desired offset of Fif being 200 KHz, F1 being 1930 MHz and F2 being 2127.5 MHz, the frequency of oscillator 70 is shown at 1732.7 MHz. A connection from step sweep generator 40 is made to oscillator 70 to provide the sweep offset FM. Also added in place of the phase detector 56 of FIG. 5 are 0 degree splitter 58 mixers 60 and 62 and output bandpass filters 66 and 68.

In the circuitry of FIG. 7, the mixer 60 has an input receiving the reflected signal from the PIM source through bandpass filter 32. The mixer 62 has an input receiving a reference signal from the output of bandpass filter 46. A second input of the mixers 60 and 62 receive the output of local oscillator 70 as provided through splitter 58. The output of filter 68, thus, provides a reference signal downconverted to 200 KHz, while the output of the filter 66 provides the reflected signal for measurement downconverted to 200 KHz. The fixed 200 KHz signals from filters 66 and 68 can be processed to measure PIM amplitude as well as distance to fault using phase angle.

Figure 8:
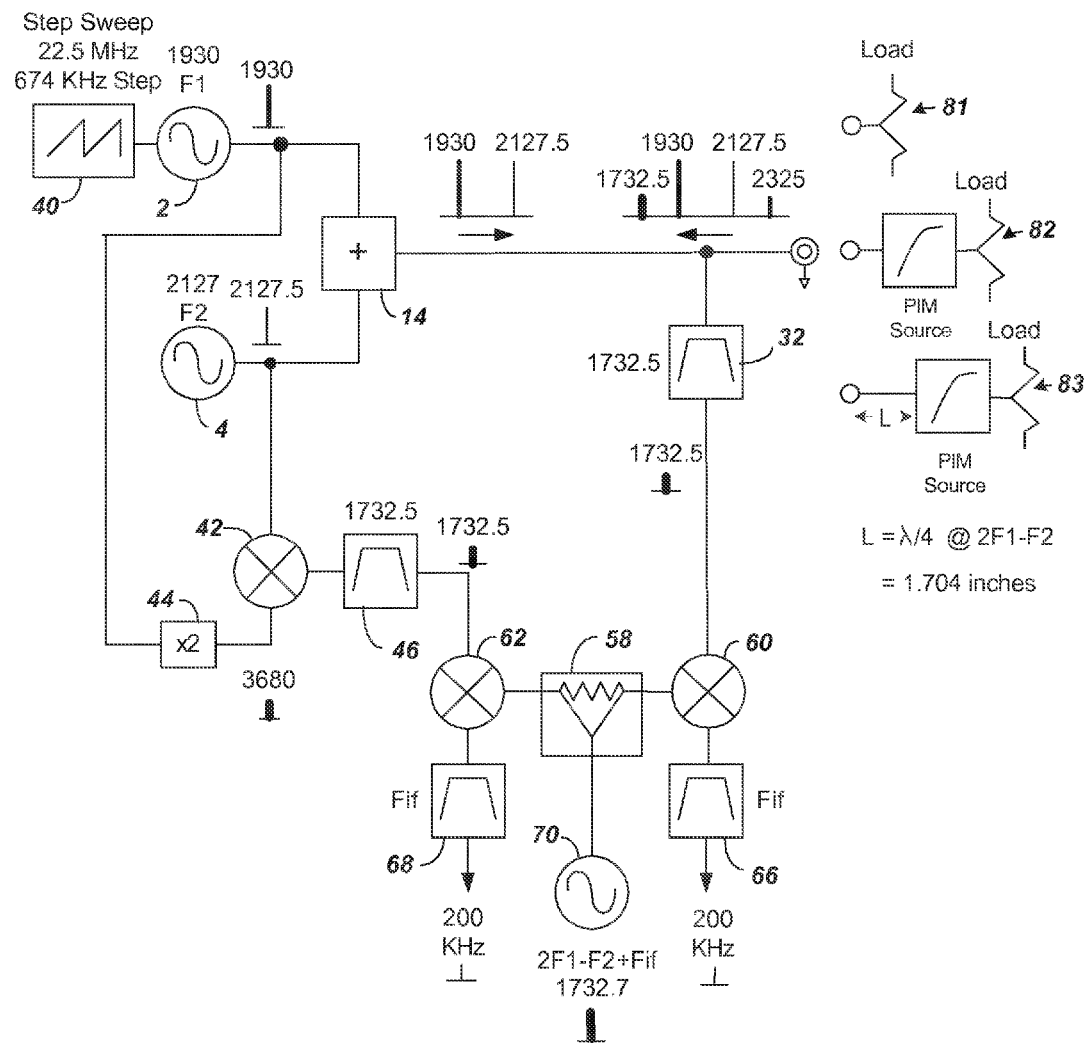
FIG. 8 shows the PIM measurement circuit of FIG. 7 with calibration components added to enable calibrating the distance and amplitude of the reflected PIM measurement.

FIG. 8 shows the PIM measurement circuit of FIG. 7 with calibration components added to enable calibrating the distance, phase and amplitude for a one port PIM reflection measurement. A non PIM producing load 81 provides a first calibration component used to provide a phase and amplitude reference to measure the system's inherent PIM for cancellation. A known PIM standard with a series load 82 is connected and measured relative to the standard load 81 as a second calibration component. Finally, a PIM source with a ¼ wavelength section of line length (L) at the frequency of 2F1−F2 is attached as a third standard 83, enabling the different length line to produce a 180 degree phase shift on the returned PIM measurement for comparison. The resulting calibration will yield a full scale measurement of the known PIM standards down to the system noise floor.

Figure 9:
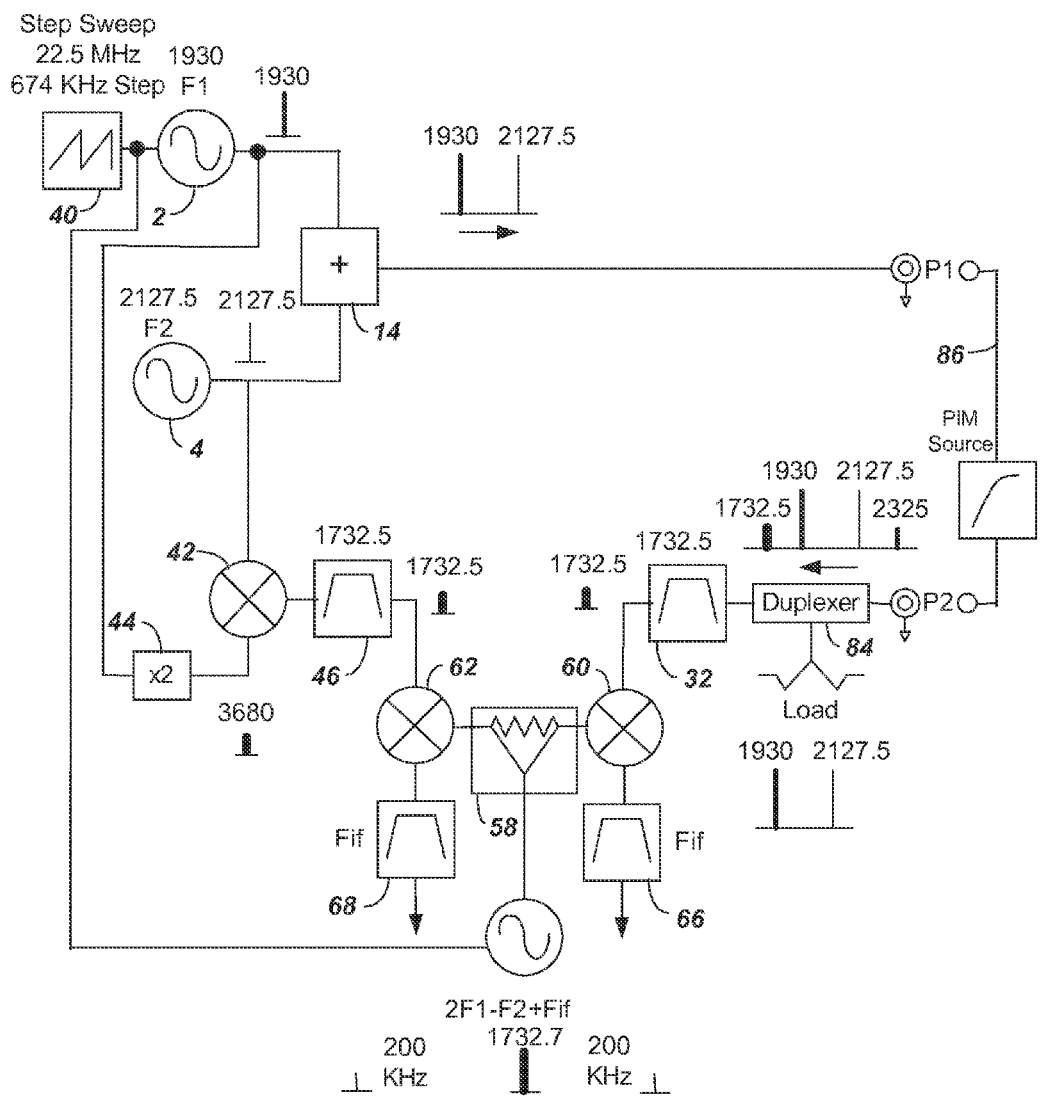
FIG. 9 is a block diagram showing modification of the circuit of FIG. 7 to make a through PIM measurement.

FIG. 9 is a block diagram showing modification of the circuit of FIG. 7 to make a through PIM measurement. The circuit includes both a port P1 and port P2. The return path through bandpass filter 32 is disconnected from its connection to port P1 in FIG. 8, and connected through a duplexer 84 to port P2 in FIG. 9. An unknown PIM source with cable 86 is connected between ports P1 and P2 for the through measurement. As illustrated, the two signals F1=1930 MHz and F2=2127.5 MHz are provided to port P1, while those signals along with signals of 2F1−F2=1732 MHz and 2F1+F2=2325 MHz generated by the P1M source proceeds through port P2 and duplexer 84. The duplexer 84 sends the signals at 1930 MHz and 2127.5 MHz to a load, while the remaining signals are provided through bandpass filter 32 centered at 1732.5 MHz. Thus, the 1732.5 MHz forward unknown PIM signal is provided to mixer 62, while the 1732.5 frequency reference signal is provided through mixer 60 for downconversion and subsequent measurement.

Figure 10:
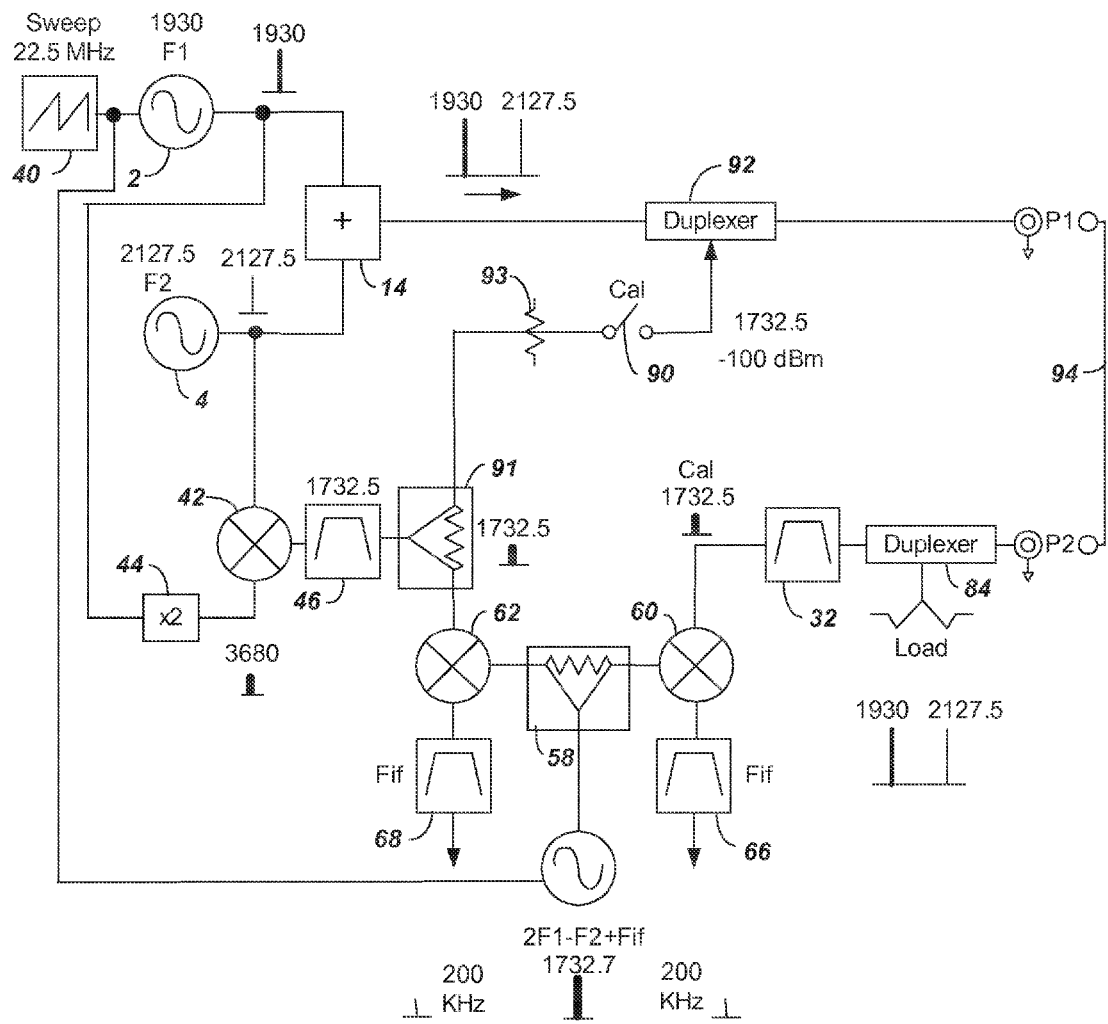
FIG. 10 shows modification to the measurement circuit of FIG. 9 that allows for a through calibration to enable characterization of the signal output of mixer 42.

FIG. 10 shows modification to the measurement circuit of FIG. 9 that allows for a through calibration of a known PIM signal. The circuit of FIG. 10 modifies the circuitry of FIG. 9 to include an internal calibration switch 90, a 0 degree splitter 91 a precision attenuator 93 and duplexer 92. The calibration switch 90 allows connection of the precision calibrated 1732.5 MHz output of filter 46 to duplexer 92 when calibration is desired. The 0 degree splitter 91 enables the signal from filter 46 to be provided to the calibration switch 90 as well as to the mixer 62 for downconversion to provide a reference signal. The duplexer 92 connects to the calibration switch 90 and allows forward transmission of the reference PIM signal level through switch 90 to port P1, as well as the signal from combiner 14 to pass to test port P1. The duplexer 92 prevents any signals other than the 2*(F1+FM)−F reference signal and F1+FM and F2 from leaving port P1 while preventing F1+FM and F2 from entering the switch 90. The thru line 94 is used during calibration along with calibration switch 90 so that the calibration signal from attenuator 93 is provided through test ports P1 and P2 and is then downconverted to a thru signal using mixer 60. The thru signal is compared with the reference signal output from mixer 62 to enable the thru calibration.

Figure 11:
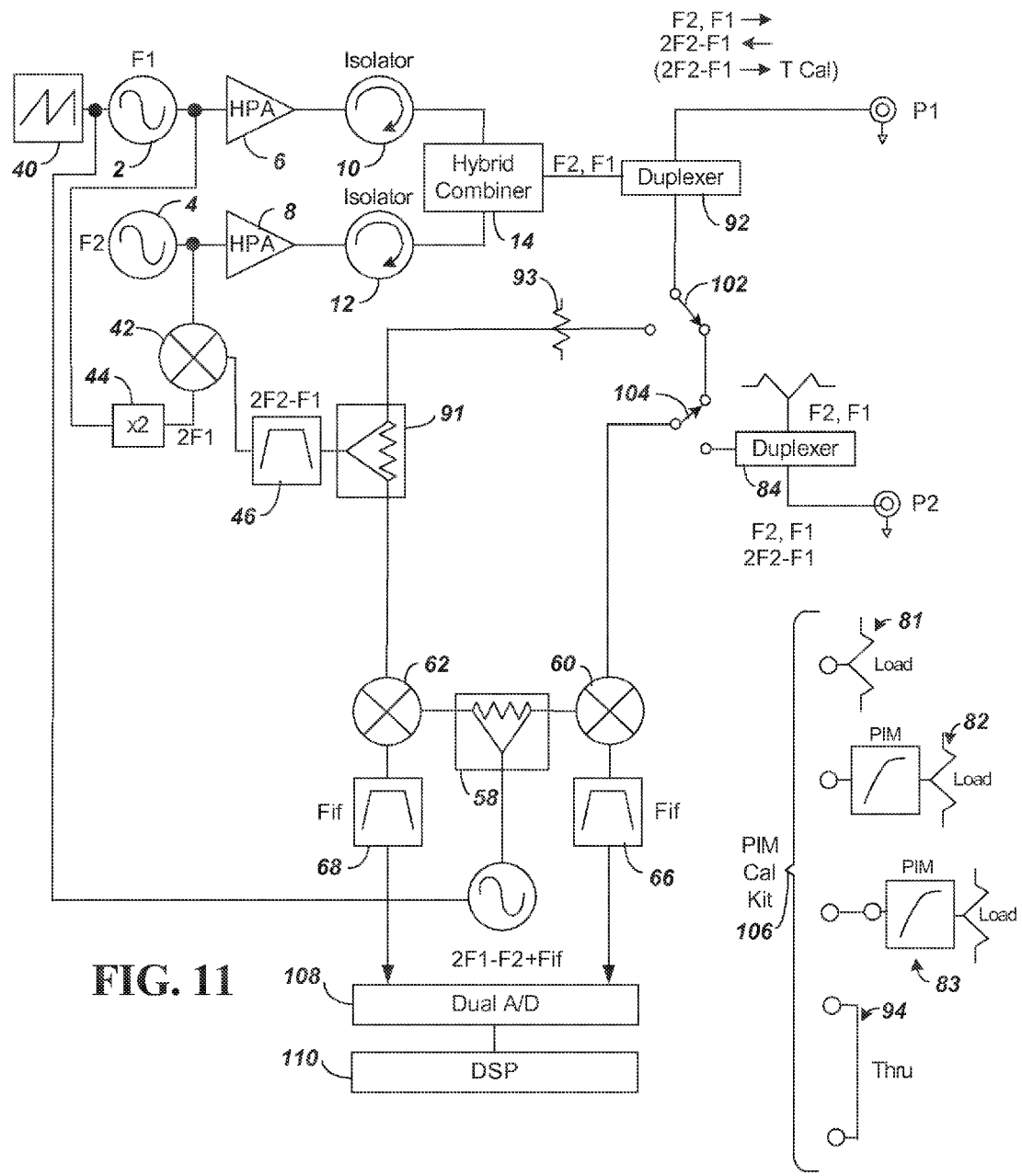
FIG. 11 shows a full implementation of embodiments of the present invention as shown in FIG. 7 through FIG. 10.

FIG. 11 shows a full implementation of embodiments of the present invention as shown in FIG. 7 through FIG. 10. The circuit of FIG. 11 modifies the circuitry of FIG. 10 to substitute calibration switch 90 with switches 102 and 104. Switch 102 provides the same function of switch 90 to connect or disconnect the output of 0 degree splitter 91 and attenuator 93 to duplexer 92 during through calibration. Switch 102 in combination with switch 104 further allows the test port P1 to be connected to the mixer 60 to provide a downconverted reflected signal for comparison to the reference signal measurement from mixer 62. The switch 104 alternatively allows the test port P2 to be connected to mixer 60 to provide a downconverted through (T) measurement, or to allow the switch 102 to connect test port P1 to mixer 60. The calibration components as well as PIM measurement devices are combined as a PIM calibration kit 106 and can be connected for test measurements as described with respect to FIGS. 8 through 10. FIG. 11 further shows that the frequency domain can be converted to time or distance calculation using a DSP 110. The DSP 110 can be simply programmed to perform the distance calculation from measurements taken using the test setup of FIG. 11. The DSP 110 for determining distance can be a single device that also does processing of the, reflected and through signals for a test measurement. Although shown as a DSP 110, it is understood that a microprocessor, field programmable gate array (FPGA), or a general application specific integrated circuit (ASIC) can be used to provide frequency to time domain conversion to determine distance to a PIM either together or separate from other measurement circuitry. The DSP 110 is provided in combination with a dual ND converter 108. The dual converter 108 converts the analog forward signal from one analog port to digital, and converts the analog reverse signal or through signal at the other port to a digital signal for processing in the DSP 110. Although shown with a dual ND converter 108, separate simultaneously triggered converters can be used. As indicated previously, the system of FIG. 11 provides PIM measurements and differs from a standard VNA by separating forward and reverse signals using duplexer 92 rather than a directional coupler.

In one illustrative example, a PCS device is used along with an AWS device to illustrate how frequencies can create passive intermodulation (PIM). In the example, the PCS transmit operation frequency is 1930 MHz and the AWS transmit frequency is 2127.5 MHz. The AWS receive channel operates in the range of 1710 MHz to 1755 MHz. A ΔF of +/−11.25 MHz centered at the PCS frequency of 1930 will produce an intermodulation frequency at 2*1930−2127.5 or 1732.5 MHz with a ΔF of +/−22.5 MHz due to the 2× multiplier in the intermodulation equation, or 1732.5+/−22.5 MHz. This will interfere with the AWS receive channel range of 1710-1755 MHz, and the distance to PIM measurement will indicate the amplitude of the interference as well as the distance to any defective component causing the PIM.

The minimum distance that can be measured to a fault in a distance to PIM causing defect according to embodiments of the present invention can be easily calculated using the formula below. The minimum distance is related to the velocity of propagation for the cable. For a typical low loss cable having a propagation of 0.9 and using a sweep frequency Fswp of 45 MHz, due to the 2F1 doubling of sweep frequency, can be calculated as follows:

$$dist_{min} = \frac{C * Vp}{2 * Fswp} = \frac{186{,}000 \text{ mi/S} * 5280 \text{ Ft/mi} * 0.9}{2 * 45 * 10^6} = 9.82 \text{ Ft}$$

Figure 12:
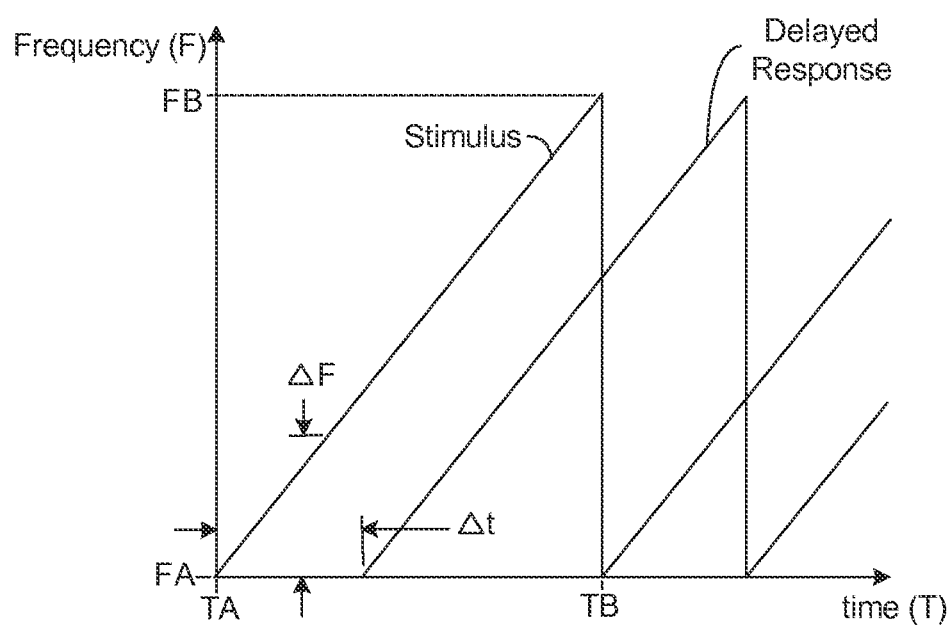
FIG. 12 provides a graph of a stimulus signal and a delayed response signal caused by a PIM reflection to illustrate variables used to calculate a difference frequency, $\Delta F$.

Determination of distance from frequency caused by delay ΔF can similarly be easily calculated as described below with reference to FIG. 12. FIG. 12 provides a graph of a stimulus signal and a delayed response signal caused by a PIM reflection. The graph of FIG. 12 plots change of frequency versus change in time. The difference frequency caused by delay ΔF shows the frequency change from the stimulus to the delayed response signal. Similarly, the change of time Δt shows a time delay between the stimulus and the response. An initial time TA and initial frequency FA are shown for the plots. Further a frequency FB is shown illustrating the maximum frequency difference between the minimum frequency FA and maximum frequency of both the stimulus and delayed response signal.

With reference to FIG. 12, the formula for difference frequency ΔF is as follows:

$$\Delta F = \Delta t \frac{FB - FA}{TB - TA} = \Delta t \frac{Fswp}{tswp}$$

The formula for Δt can further be calculated as follows:

$$\Delta t = \frac{2 * dist}{C * Vp}$$

Substituting the formula for Δt, the formula for ΔF becomes:

$$\Delta F = \frac{2 * dist * Fswp}{C * Vp * tswp}$$

For an FM CW linear saw tooth ramp, and assuming a non-aliased cable to PIM distance of 100 m or 328 Ft and Vp of 0.9, sweep time, tswp, is as follows:

$$tswp = \frac{4 * dist}{C * Vp} = \frac{4 * 328 \text{ ft}}{186{,}000 \text{ mi/S} * 5280 \text{ Ft/mi} * 0.9} = 1.4844 \text{ uS}$$

Providing this value for tswp into the formula for ΔF and using the sweep frequency Fswp of 45 MHz and Vp of 0.9, we obtain ΔF as follows:

$$\Delta F = \text{dist in feet} * \frac{2 * 45 * 10^6}{186{,}000 \text{ mi/S} * 5280 \text{ Ft/mi} * 0.9 * 1.488 * 10^{-6}} =$$

$$\text{dist in feet} * 0.68597$$

Although the present invention has been described above with particularity, this was merely to teach one of ordinary skill in the art how to make and use the invention. Many additional modifications will fall within the scope of the invention, as that scope is defined by the following claims.

What is claimed:

1. An apparatus for measuring passive intermodulation (PIM) comprising: a signal sweep generator;
   a first signal source providing a signal with a first frequency F1, the first signal source connected to the signal sweep generator to provide an offset sweep signal on the frequency F1 at the output of the first signal source;
   a second signal source providing a second signal with a second frequency F2; and a first signal combiner having a first input connected to the first signal source, a second input connected to the second signal source and an output providing a signal combining the first signal and the second signal to provide an output with frequencies F1 and F2 to a test port that is connectable to a PIM source;
   a reflected signal passband filter connected to the test port, the reflected signal passband filter for providing a reflected signal of frequency 2F1-F2 from the test port;
   a downconversion signal port for providing a signal frequency of approximately 2F1-F2; and
   a second signal combiner having a first input receiving and combining the output of the reflected signal passband filter, a second output connected to the downconversion signal port and providing an output enabling analysis of the sweep signal to determine a distance to the PIM source.

2. The apparatus of claim 1, further comprising:
   a frequency multiplier connected to the output of the first signal source for multiplying the frequency of the first signal source by two to provide an output of frequency 2F1;
   a first mixer having a first input connected to the output of the second signal source, a second input connected to the output of the frequency multiplier and an output forming the downconversion signal port providing a signal having a frequency of 2F1-F2;
   a downconversion signal passband filter having an input connected to the output of the first mixer and an output,
   wherein the second signal combiner comprises a second mixer, the second mixer having a first input connected to the output of the downconversion signal passband filter, a second input connected to the output of the reflected signal passband filter, and an output providing the output enabling analysis of the sweep signal to determine a distance to the PIM source.

3. The apparatus of claim 1, further comprising:
   a frequency multiplier connected to the output of the first signal source for multiplying the frequency of the first signal source by two to provide an output of frequency 2F1;
   a third signal source providing a signal with the second frequency F2;
   a first mixer having a first input connected to the output of the third signal source, a second input connected to the output of the frequency multiplier and an output forming the downconversion signal port providing a signal having a frequency of 2F1-F2;
   a downconversion signal passband filter having an input connected to the output of the first mixer and an output,
   wherein the second signal combiner comprises a second mixer, the second mixer having a first input connected to the output of the downconversion signal passband filter, a second input connected to the output of the reflected signal passband filter, and an output providing the output enabling analysis of the sweep signal to determine a distance to the PIM source.

4. The apparatus of claim 1, further comprising:
   a frequency multiplier connected to the output of the first signal source for multiplying the frequency of the first signal source by two to provide an output of frequency 2F1;
   a first mixer having a first input connected to the output of the second signal source, a second input connected to the output of the frequency multiplier and an output forming the downconversion signal port providing a signal having a frequency of 2F1-F2;
   a downconversion signal passband filter having an input connected to the output of the first mixer and an output,
   wherein the second signal combiner comprises a phase detector, the phase detector having a first input connected to the output of the downconversion signal passband filter, a second input connected to the output of the reflected signal passband filter, and an output providing the output enabling analysis of the sweep signal to determine a distance to the PIM source.

5. The apparatus of claim 1, further comprising:
   a frequency multiplier connected to the output of the first signal source for multiplying the frequency of the first signal source by two to provide an output of frequency 2F1;
   a first mixer having a first input connected to the output of the second signal source, a second input connected to the output of the frequency multiplier and an output forming the downconversion signal port providing a signal having a frequency of 2F1-F2;
   a downconversion signal passband filter having an input connected to the output of the first mixer and an output;
   a 0/90 degree splitter having an input connected to the downconversion signal passband filter, a first output shifting phase of the input by substantially 90 degrees and a second output not substantially shifting phase of the input;
   wherein the second signal combiner comprises:
   a splitter having a first input connected to the output of the reflected signal bandpass filter, the splitter providing a first output and a second output;
   a first downconversion mixer having a first input connected to the first output of the splitter, a second input connected to the first output of the 0/90 degree splitter, and having an output providing a reference signal that can be uccd is usable to enable analysis of the sweep signal to determine a distance to the PIM source; and
   a second downconversion mixer having a first input connected to the second output of the splitter, a second input connected to the second output of the 0/90 degree splitter, and having an output providing a reflected signal that is usable to enable analysis of the sweep signal to determine a distance to the PIM source.

* * * * *